United States Patent
Gründl et al.

(10) Patent No.: US 6,279,336 B1
(45) Date of Patent: Aug. 28, 2001

(54) ASSEMBLY FOR SWITCHING ELECTRICAL POWER

(75) Inventors: Andreas Gründl, Munich; Bernhard Hoffmann, Starnberg, both of (DE)

(73) Assignee: Grundl und Hoffmann GmbH Gesellschaft fur Elektrotechnische, Starnberg (DE)

( * ) Notice: Subject to any disclaimer, the term of this patent is extended or adjusted under 35 U.S.C. 154(b) by 0 days.

(21) Appl. No.: 09/409,931

(22) PCT Filed: Feb. 12, 1998

(86) PCT No.: PCT/EP98/00796

§ 371 Date: Oct. 7, 1998

§ 102(e) Date: Sep. 28, 1998

(87) PCT Pub. No.: WO95/13860

PCT Pub. Date: May 26, 1995

(30) Foreign Application Priority Data

Apr. 4, 1997 (DE) .................................... 197 13 984

(51) Int. Cl.$^7$ ............................. F25D 15/00; F28D 15/00
(52) U.S. Cl. .................. 62/259.2; 62/119; 165/104.27; 165/104.33
(58) Field of Search ................... 62/259.2, 119; 165/104.21, 104.27, 104.33

(56) References Cited

U.S. PATENT DOCUMENTS

| | | | |
|---|---|---|---|
| 2,083,611 | * 6/1937 | Marshall | 165/104.21 |
| 4,036,291 | * 7/1977 | Kobayashi et al. | 165/105 |
| 4,502,286 | * 3/1985 | Okada et al. | 62/119 |
| 4,554,966 | * 11/1985 | Vasiliev et al. | 165/104.21 |
| 4,557,225 | 12/1985 | Sagues et al. | 123/41.31 |
| 4,607,498 | * 8/1986 | Dinh | 62/185 |
| 4,766,520 | 8/1988 | Huber et al. | 361/421 |
| 4,831,211 | 5/1989 | McPherson et al. | 174/35 R |
| 5,004,974 | 4/1991 | Cattaneo et al. | 324/117 R |
| 5,041,761 | 8/1991 | Wright et al. | 315/129 |
| 5,075,014 | 12/1991 | Sullivan | 210/747 |
| 5,132,896 | 7/1992 | Nishizawa et al. | 363/144 |
| 5,203,399 | * 4/1993 | Koizumi | 165/104.33 |
| 5,583,429 | 12/1996 | Otaka | 324/127 |
| 5,670,032 | 9/1997 | Friese et al. | 204/424 |
| 5,689,089 | 11/1997 | Polak et al. | 174/52.4 |
| 5,789,704 | 8/1998 | Kawakita | 174/52.1 |
| 6,005,383 | 12/1999 | Savary et al. | 324/117 H |
| 6,005,771 | 12/1999 | Bjorndahl et al. | 361/699 |
| 6,049,263 | 4/2000 | Vilou | 335/126 |

FOREIGN PATENT DOCUMENTS

| | | | |
|---|---|---|---|
| 37 40 236 | 6/1989 | (DE) | H01L/23/46 |
| 40 27 969 | 11/1991 | (DE) | H02M/7/48 |
| 0 429 188 | 5/1991 | (EP) | H05K/7/20 |
| 0 586 793 | 3/1994 | (EP) | H02M/7/00 |
| 2 580 762 | 10/1986 | (FR) | F16J/15/06 |
| WO 94 27157 | 11/1994 | (WO) | G01R/15/02 |
| WO 95 13860 | 5/1995 | (WO) | B01D/69/02 |

* cited by examiner

Primary Examiner—William Doerrler
(74) Attorney, Agent, or Firm—Haverstock & Owens LLP

(57) ABSTRACT

The invention relates to an assembly for switching electrical power, wherein a semiconductor switch is arranged in a pressure-resistant vessel which is partially filled with an inert liquid in order to effect a fluid cooling of the semiconductor switch during operation, characterised in that the interior of the vessel is coupled with a cooling circuit, with at least one vapor line leading from the vessel to a radiator, and at least one liquid line leading from the radiator to the vessel, with the liquid line being arranged at least sectionwise within the vapor line and being extended from a connection point at the vessel into the interior of the vessel to such a length that its free end opens below the liquid level of the cooling liquid.

10 Claims, 3 Drawing Sheets

ASSEMBLY FOR SWITCHING ELECTRICAL POWER

FIELD OF THE INVENTION

The present invention relates to an assembly for switching electrical power, wherein at least one semiconductor switch is arranged in a power electronics assembly.

BACKGROUND OF THE INVENTION

Such power electronics assemblies are employed e.g. in the form of half bridge arrangements for forming converters for the most different applications, e.g. for feeding polyphase machines, permanent magnet machines, and the like (see e.g. German Patent Publication DE-A-40 27 969).

However, there is the problem that the power density, i.e. the power output related to the volume of the assembly is relatively low with the conventional arrangements. Moreover, the weight of conventional arrangements is relatively high.

From U.S. Pat. No. 5,132,896 a converter arrangement is known which comprises plate-shaped feed lines with large surface areas in order to reduce the effect of distributed inductances of the conductors which are used for connecting the capacitors and the semiconductor switches. With this, large damping capacitors for the compensation of line inductances are avoided. Moreover, heat radiation can be improved by the large area configuration of the plate-shaped feed lines. Moreover, the plate-shaped feed lines are designed in such a manner that amperage and direction of the current flow through the plate-shaped feed lines minimize the effect of the distributed inductances.

The large area feed lines of this converter assembly, however, only serve to reduce interference inductances and are employed as feed lines to large electrolytic capacitors.

From European Patent Publication 586 793 B1 a half bridge arrangement is known which, in comparison, has a considerably better power density. Therein, the initially described semiconductor switch is arranged in a half bridge arrangement which is further developed in that the capacitor arrangement is formed by at least one junction capacitor at one printed circuit board carrying one or several of such semiconductor switches and/or by at least one paper capacitor formed as a hollow winding, with the semiconductor switches being arranged in the paper capacitor formed as a hollow winding and a fluid cooling being provided in the hollow winding. The contents of this publication are herewith expressly referred to.

Based on this, the invention relates to further developments of this known arrangement, which serve to further increase the power density, to widen the ranges of application of this arrangement, and to make manufacture and operation of this arrangement more economical, simple and safer.

SUMMARY OF THE INVENTION

According to an aspect of the invention, the semiconductor switch is arranged in a pressure-resistant vessel which is partially filled with an inert liquid in order to effect a fluid cooling of the semiconductor switch during operation and the interior of the vessel is coupled with a cooling circuit, with at least one vapour line leading from the vessel to a radiator, and at least one liquid line leading from the radiator to the vessel, with the liquid line being arranged at least sectionwise within the vapour line and being extended from a connection point at the vessel into the interior of the vessel to such a length that its free end opens below the liquid level of the cooling liquid.

In this manner the pressure-resistant vessel is to be provided with only one cutout or one opening for the connections with the cooling circuit. Moreover, the space requirement for the line to/from the radiator is reduced.

The arrangement is preferably further developed in such a manner that the vapour line at the radiator side opens at a manifold chamber, and the liquid line at the radiator side opens at a collecting chamber, with at least one cooling line being arranged between the manifold chamber and the radiator chamber, at the inner wall of which vapour from the vapour line condensates and flows as liquid into the collecting chamber.

The cooling lines can also be forced-cooled. This can be realized with the inventive arrangement being employed in a motor vehicle by means of the air stream and/or a blower. Alternatively, a liquid cooling can serve as a heat sink for the cooling lines.

In a preferred embodiment of the invention, a compensating tank is connected at the manifold chamber via a throttle section.

According to the invention the semiconductor switch is arranged in a pressure resistant essentially cylindrical vessel which is partially filled with an intert liquid; in order to effect a fluid cooling of the semiconductor switch during operation the cylindrical vessel comprises a flange which intersects its wall, which is adapted for receiving a connection of a radiator, with the connection being connected with the flange by means of screw connections and with spring elements being provided at each of the screw connections which resiliently bias the connection against the flange.

Due to the fact that the pressure in the vessel interior increases during operation of the arrangement with the heat loss of the semiconductor switches heating the inert liquid to its boiling point, safeguarding of the vessel against bursting must be provided by suitable measures. The usually employed burst disks are very expensive and require individual type tests.

Thus the invention provides an arrangement which can be assembled very easily. Because the connection for the radiator need not be welded to the vessel, but can be assembled, extensive welding operations are omitted. If the arrangement has previously been manufactured from aluminium, the expensive and virtually not feasible aluminium weld test is also omitted. In addition, the individual components can be tested before they are assembled. Furthermore, a surface treatment of the individual components can be carried out more easily. Another advantage is the considerably larger opening cross section in the case of an overpressure, compared to burst disks, because virtually the entire connection is lifted off the flange. In addition, the spring force of the spring arrangement seals the vessel again as soon as the pressure within the vassel drops below the predetermined value.

The spring elements are preferably formed by at least one cup spring or a cup spring pack. These springs are very favourably priced and their force/travel characteristic can be set very precisely.

In a preferred embodiment the screw connections are formed by threaded bolts the shaft area of which is surrounded by the spring elements.

According to the invention the spring elements are dimensioned and biased by screwing in the screw connections in such a manner that the connection clears the flange upon a predetermined fluid pressure prevailing within the vessel.

Preferably, a sealing element is arranged between the flange and the connection.

According to another aspect of the invention the semiconductor switch is arranged in a pressure-resistant vessel which is partially filled with an inert liquid and in order to effect a fluid cooling of the semiconductor switch during operation the interior of the vessel is coupled with a cooling circuit, with an outlet towards atmosphere being provided in the cooling circuit, which is closed by a filter arrangement which is permeable for air and impermeable for vapour from the inert liquid.

This arrangement enables the filling of the arrangement with inert liquid in a simple manner: Air which is trapped in the vessel during this operation and which would affect the function of a (condensation) radiator during operation will be expelled from the vessel during operation through the filter arrangement.

In a preferred embodiment the filter arrangement is formed by a molecular filter, preferably by a plastic foil.

In addition, a stabilizer is arranged at the side of the filter arrangement facing towards the vessel interior and/or at the side of same facing away from it.

In addition, a valve arrangement can be arranged at the side of the filter arrangement facing away from the vessel interior.

This allows to design the control lines shorter and thus less susceptible to interferences. Moreover, the HF shielding which is ensured in any case by the vessel can be utilized both with respect to interference and emissions for the drive circuit with the computer unit.

Furthermore, standardized signals can be used for the setpoint specifications (e.g. CAN-BUS) in order to control the arrangement.

According to another aspect of the invention the semiconductor switch is arranged in a pressure-resistant vessel which is partially filled with an inert liquid in order to effect a fluid cooling during operation; therefore, the semiconductor switch has no plastic or ceramic sheathing and is completely immersed in the inert liquid.

This enables a considerably higher power density and thus a more compact and therefore more favourably priced construction of the overall arrangement. The semiconductor devices in the inert liquid within the vessel are excellently cooled and protected against the ambient atmosphere.

According to another aspect of the invention the semiconductor switch is arranged in a pressure-resistant vessel which is partially filled with an inert liquid in order to effect a fluid cooling during operation, and power signal carrying lines or current supply lines are routed in the vessel interior in such a manner that they are essentially completely immersed in the inert liquid.

This, too, enables a considerably higher power density and thus a more compact and therefore more favourably priced construction of the overall arrangement. Because of the inert liquid the lines within the vessel are excellently cooled and protected against the ambient atmosphere. Moreover, the inert liquid insulates the lines against one another. Compared to conventional arrangements, the lines can be dimensioned with considerably thinner cross sections, e.g. a reduction of the cross section is possible in such a manner that lines can be operated at a continuous load of up to 200 A/mm$^2$, while under continuous operation of these lines in air atmosphere a power density of only 15 A/mm$^2$ would be possible.

BRIEF DESCRIPTION OF THE DRAWINGS

Further properties, characteristics and alternative configurations of the invention will be explained in the following with reference to the drawings which illustrate currently preferred embodiments of the subject matter of the invention.

DETAILED DESCRIPTION OF THE PREFERRED EMBODIMENT

The aspects which are essential for the invention are realized by way of example in a half bridge arrangement, with a single-phase converter serving as a potential application example for such a half bridge arrangement, which is constructed by two identical half bridge arrangements. In the following the principal construction of only one arrangement will therefore be explained.

The half bridge arrangement comprises MOSFET pairs which are connected in parallel and which act as semiconductor switches. Two each of the MOSFETs are connected in series so that each first MOSFET of each pair with its source terminal is at a high voltage potential $V_{SS}$, and each second MOSFET of each pair with its drain terminal is at a low voltage potential $V_{DD}$. For the formation of an output terminal of the drain terminal each of the first MOSFETs is connected with the source terminal of each of the second MOSFETs. One driver means each for the group of first MOSFETs or the group of second MOSFETs, respectively, is connected with the control inputs connected in parallel of each group of the first and second N channel MOSFETs.

Between the high and the low voltage potential $V_{SS}$ and $V_{DD}$ a capacitor is arranged which acts as a back-up capacitor. The capacitor arrangement is formed, on the one hand, by a junction capacitor at a printed circuit board carrying the MOSFETs. On the other hand, the capacitor arrangement is formed by a paper capacitor formed as a hollow winding. The hollow winding is designed essentially cylindrical and consists of several copper layers each with an insulation layer. In the interior of the paper capacitor formed as a hollow winding several printed circuit boards with individual semi-conductor arrangements are stacked above each other. The hollow winding is sealed fluid-tight at one end by means of a convex protective cap, while it tapers bottle-shaped at the other end to terminate in a connection piece at which the connections for the supply voltages, the output lines, and the control lines lead to the outside.

The hollow winding forms a vessel 10 which is designed pressure resistant up to approx. 15 bar. The interior of the hollow winding is filled with a liquid fluorocarbon, with the liquid covering the semiconductor switches 12. A free space is provided between the liquid level 14 (see e.g. FIG. 3) and the inner wall of the vessel 10 so that a gaseous phase of the fluorocarbon can emerge from the liquid phase. The gas pressure in the hollow winding is adjusted according to the gas pressure curve of the fluorocarbon between 50 mbar and 3 bar in such a manner that the liquid phase of the fluorocarbon starts boiling already upon a slight heating of the MOSFETs during operation. In this way, it can be achieved that the temperature difference between the semiconductor switches and the ambient atmosphere of the hollow winding amounts to only approx. 10° C.

Figure 1:
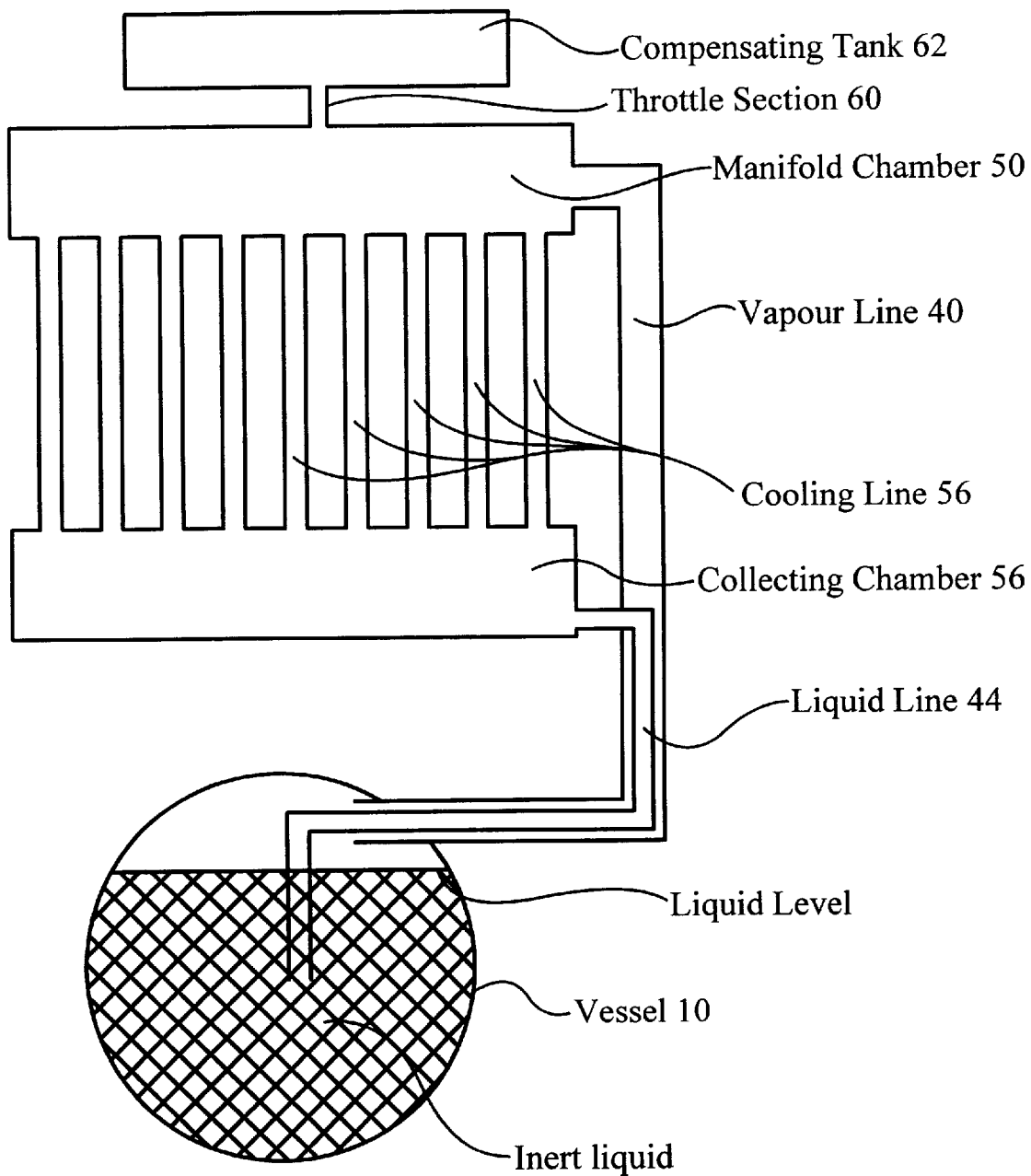
FIG. 1 shows a schematic illustration of a cross section of a first aspect of the invention.

The gaseous phase of the inert liquid is externally cooled by a convection cooling system connected with the vessel or by a blower (see e.g. FIG. 1). Thereby the gaseous phase of the fluorocarbon condensates at the inner wall of the cooling lines which are externally cooled and is returned in the liquid form via a liquid line to the liquid fluorocarbon within the vessel, which surrounds the MOSFETs.

FIG. 1 shows the vessel 10 filled with inert fliquid, the interior of which is coupled with a cooling circuit. A vapour line 40 leads from the vessel 10 to a radiator 42, and a liquid line 44 leads from the radiator 42 to the vessel 10. The liquid line 44 is arranged sectionwise within the vapour line 40 and is extended from a connection point 46 at the vessel 10 into the interior of the vessel 10 to such a length that its free end opens below the liquid level of the inert liquid. The vapour line 40 opens at the radiator side at a manifold chamber 50, and the liquid line opens at the radiator side at a collecting chamber. Alternatively, the vapour line 40 can also open at the collecting chamber 52. In this case the vapour in the cooling lines rises upwards and the liquid flows downward. Between the manifold chamber 50 and the collecting chamber 52 several parallel running cooling lines 56 are arranged at the inner wall of which vapour from the vapour line 40 condensates and flows as a liquid into the collecting chamber 52 and from there into the vessel 10.

A compensating tank 62 is connected with the manifold chamber 50 via a throttle section 60.

Figure 2:
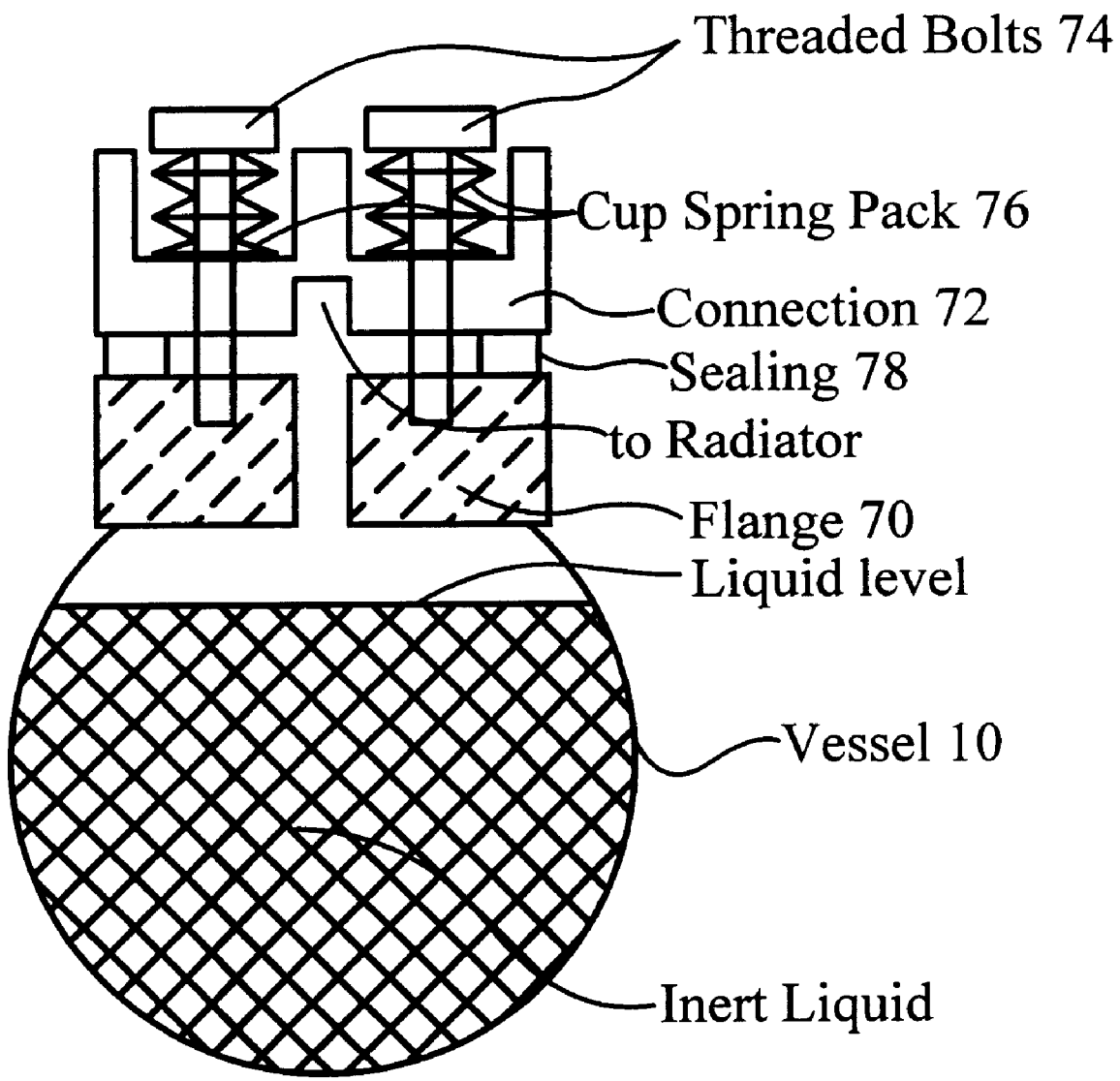
FIG. 2 shows a schematic illustration of a cross section of a second aspect of the invention.

As shown in FIG. 2 the cylindrical vessel 10 has a flange 70 which intersects its wall along the surface and which when viewed from above has a rectangular shape, which is adapted to receive a correspondingly designed and dimensioned connection 72 of a radiator (as shown e.g. in FIG. 1). The connection 72 is connected with the flange 70 by means of screw connections 74. At each of the screw connections 74 spring elements 76 are provided which resiliently bias the connection 72 against the flange 70. The spring elements 76 are formed by a cup spring pack.

The screw connections 74 are formed by threaded bolts the shaft area of which is surrounded by the spring elements 76. The spring elements 76 are dimensioned and biased by screwing in the screw connections in such a manner that the connection 72 clears the flange 70 upon a predetermined fluid pressure within the vessel 10. Finally, a sealing element 78 is arranged between the flange 70 and the connection 72.

Figure 3:
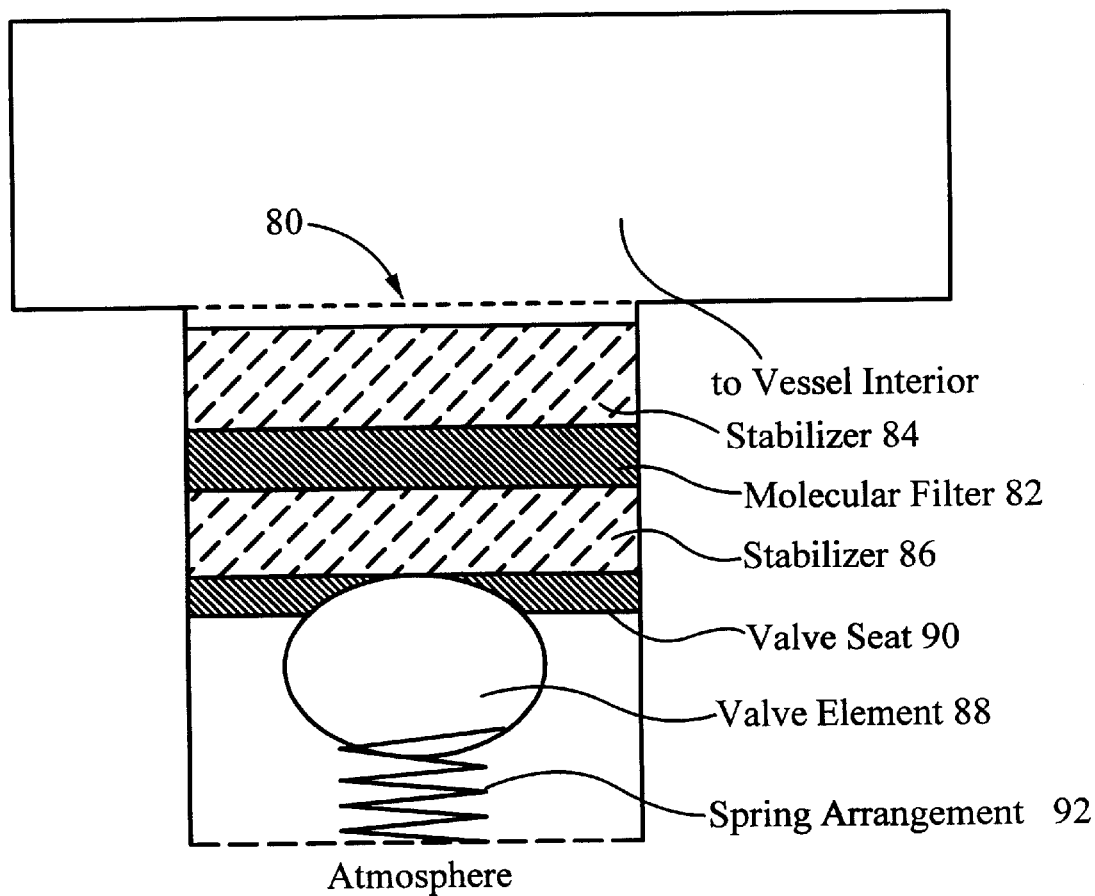
FIG. 3 shows a schematic illustration of a cross section of a third aspect of the invention.

FIG. 3 illustrates how the interior of the vessel 10 is coupled with a cooling circuit, with an outlet 80 towards atmosphere being provided in the cooling circuit, which is closed by a filter arrangement 82 which is permeable for air and impermeable for vapour from the inert liquid. The filter arrangement 82 is formed by a molecular filter made from plastic foil. For the mechanical relief of the molecular filter one each stabilizer 84, 86 in the form of an air-permeable ceramic plate or the like is arranged on the side facing towards the interior of the vessel 10 and on the side facing away from the interior of the vessel 10 of the filter arrangement 82.

In addition, a valve arrangement consisting of a valve element 88, a valve seat 90, and a spring arrangement 92 which urges the valve element 88 against the valve seat 92 is arranged at the side of the filter arrangement 82 facing away from the interior of the vessel 10. The spring arrangement 92 is dimensioned in such a manner that it opens upon an overpressure within the vessel 10.

In the operating condition of the arrangement, the molecular filter 82 is positioned above the stabilizer 84.

What is claimed is:

1. An assembly for switching electrical power comprising:

a semiconductor switch arranged in a pressure-resistant vessel comprising a liquid region containing an inert liquid in order to effect a fluid cooling of the semiconductor switch during operation, the vessel further comprising a vapour region for containing a vaporized form of the inert liquid;

wherein:
the interior of the vessel is coupled with a cooling circuit; with
at least one vapour line leading from the vapour region of the vessel to a radiator;
at least one liquid line leading from the radiator to the vessel; with
the liquid line being arranged at least sectionwise within the vapour line and being extended through the vapour region of the vessel and into the interior of the vessel to such a length that its free end opens below a liquid level of the inert liquid.

2. The assembly according to claim 1, wherein:
the vapour line at the radiator side opens into a manifold chamber;
the liquid line at the radiator side opens into a collecting chamber; with
at least one cooling line being arranged between the manifold chamber and the collecting chamber, at the inner wall of which vapour from vapour line condensates and in the form of a liquid flows into the collecting chamber.

3. The assembly according to claim 1 wherein:
a compensating tank is coupled to the manifold chamber via a throttle section.

4. An apparatus for switching electrical power comprising:
a. a pressure-resistant vessel comprising a liquid region containing an inert liquid, and a vapour region for containing a vapourized form of the inert liquid;
b. a semiconductor switch coupled to an interior of the pressure-resistant vessel, the semiconductor switch arranged in the pressure-resistant vessel such that the inert liquid provides cooling for the semiconductor switch;
c. a vapour line coupled to the pressure-resistant vessel at a pressure vessel port;
d. a liquid line extending through the vapour region of the pressure resistant vessel, wherein an outlet of the liquid line terminates within the inert liquid; and
e. a radiator coupled to the vapour and liquid lines such that the radiator condenses vapour coming from the pressure-resistant vessel to the inert liquid and further such that the inert liquid that has been condensed in the radiator replenishes the inert liquid in the pressure resistant vessel.

5. The apparatus as claimed in claim 4 wherein the radiator includes:
a. a manifold chamber coupled to the vapor line;
b. a cooling line coupled to the manifold chamber such that the cooling line condenses the vapor into the inert liquid; and
c. a collecting chamber coupled to the cooling line and the liquid line such that the collecting chamber collects the inert liquid and further such that the collecting chamber provides the inert liquid to the liquid line.

6. The apparatus as claimed in claim 5 further comprising a compensating tank coupled to the manifold chamber via a throttle section.

7. The assembly for switching electrical power according to claim 1 wherein the cooling circuit has no plastic or ceramic sheathing and is completely immersed in the inert liquid.

8. The assembly for switching electrical power according to claim 1 wherein the pressure-resistant vessel is formed within a hollow winding of a capacitor.

9. The apparatus for switching electrical power according to claim 4 wherein the cooling circuit has no plastic or ceramic sheathing and is completely immersed in the inert liquid.

10. The apparatus for switching electrical power according to claim 4 wherein the pressure-resistant vessel is formed within a hollow winding of a capacitor.

* * * * *